United States Patent
Ramaraju et al.

(10) Patent No.: US 9,021,194 B2
(45) Date of Patent: *Apr. 28, 2015

(54) MEMORY MANAGEMENT UNIT TAG MEMORY

(75) Inventors: Ravindraraj Ramaraju, Round Rock, TX (US); David R. Bearden, Austin, TX (US); Prashant U. Kenkare, Austin, TX (US); Jogendra C. Sarker, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 383 days.

This patent is subject to a terminal disclaimer.

(21) Appl. No.: 13/213,900

(22) Filed: Aug. 19, 2011

(65) Prior Publication Data

US 2013/0046928 A1 Feb. 21, 2013

(51) Int. Cl.
  *G06F 9/355* (2006.01)
  *G06F 9/38* (2006.01)
  *G06F 12/10* (2006.01)

(52) U.S. Cl.
  CPC ............ *G06F 12/1027* (2013.01); *G06F 9/355* (2013.01); *G06F 9/3832* (2013.01)

(58) Field of Classification Search
  CPC .... G06F 12/1027; G06F 9/355; G06F 9/3832
  See application file for complete search history.

(56) References Cited

U.S. PATENT DOCUMENTS

| | | | |
|---|---|---|---|
| 5,754,819 A | 5/1998 | Lynch et al. | |
| 6,088,763 A | 7/2000 | Silberman et al. | |
| 6,292,818 B1 | 9/2001 | Winters | |
| 6,466,960 B1 | 10/2002 | Winters | |
| 6,813,628 B2 | 11/2004 | Bhushan et al. | |
| 6,865,590 B2 | 3/2005 | Park | |
| 6,957,315 B2 | 10/2005 | Chauvel | |
| 7,035,127 B1 | 4/2006 | Adams et al. | |
| 7,669,034 B2 | 2/2010 | Bearden et al. | |
| 7,984,229 B2 | 7/2011 | Ramaraju et al. | |
| 8,099,580 B2 | 1/2012 | Ramaraju et al. | |
| 8,380,779 B2 | 2/2013 | Bruce et al. | |
| 2005/0050278 A1* | 3/2005 | Meier et al. | 711/128 |
| 2007/0028051 A1 | 2/2007 | Williamson et al. | |
| 2007/0033318 A1 | 2/2007 | Gilday et al. | |
| 2007/0094480 A1* | 4/2007 | Ramaraju et al. | 711/220 |
| 2010/0306302 A1* | 12/2010 | Ramaraju et al. | 708/670 |

OTHER PUBLICATIONS

M.T. Vaden et al., Design Considerations for the PowerPC 601 Microprocessor, IBM Journal of Research Development, vol. 38, No. 5, Sep. 1994.
T. Juan et al., Reducing TLB Power Requirements, International Symposium on Low Power Electronics and Design, Aug. 18-20, 1997, pp. 196-201.
Cortadella et al., "Evaluation of A+B=K Conditions w/o Carry Propagation", IEEE Transactions on Computers, Nov. 1992.
Heald, R. et al., "64 kB sum-addressed-memory cache with 1.6 ns cycle and 2.6 ns latency," IEEE JSSC, vol. 33, Issue: 11, 1998, pp. 1682-1689.
Austin et al., "Streamlining Data Cache Access w/ Fast Address Calculation", 22nd Intl Symp on Computer Architecture, 1995.

* cited by examiner

*Primary Examiner* — Aimee Li
*Assistant Examiner* — Gary W Cygiel
(74) *Attorney, Agent, or Firm* — Terrile, Cannatti, Chambers & Holland, LLP; Michael Rocco Cannatti (57) ABSTRACT

A method and data processing system for accessing an entry in a memory array by placing a tag memory unit (114) in parallel with an operand adder circuit (112) to enable tag lookup and generation of speculative way hit/miss information (126) directly from the operands (111, 113) without using the output sum of the operand adder. PGZ-encoded address bits (0:51) from the operands (111, 113) are applied with a carry-out value ($Cout_{48}$) to a content-addressable memory array (114) to generate two speculative hit/miss signals. A sum value ($EA_{51}$) computed from the least significant base and offset address bits determines which of the speculative hit/miss signals is selected for output (126).

13 Claims, 8 Drawing Sheets

MEMORY MANAGEMENT UNIT TAG MEMORY

CROSS-REFERENCE TO RELATED APPLICATIONS

The present application is related to the following application which is incorporated by reference: application Ser. No. 13/213,831, filed Aug. 19, 2011, titled "Memory Management Unit TAG Memory With CAM Evaluate Signal."

BACKGROUND OF THE INVENTION

1. Field of the Invention

The present invention is directed in general to the field of electronic circuits. In one aspect, the present invention relates to a memory access apparatus and method for accessing memory by generating way hit/miss information from base and offset address components.

2. Description of the Related Art

Data is stored or read from memory at a memory address that is typically computed by adding a base address to an offset address in order to arrive at an effective address for the data. For example, base+offset addressing is used to address memory within data caches, instruction caches, and table-lookaside-buffers (TLBs) as well as data or instructions within other CPU memory units. With such memories, the base and offset values of the memory address are used to determine if the addressed information is stored in the memory. Typically a TAG memory makes this determination by storing addresses of stored information and comparing a TAG portion of the address to the stored addresses to determine if the stored information is present in the memory. A determination that the stored information is present is typically called a hit, and the processing required to make this determination is generally time-consuming because the memory storing the TAG portions of the addresses must be accessed and then compared. In addition, the addition of the base and offset values typically performed to arrive at the effective address usually takes at least two cycles to access the memory. In the first cycle, the base and offset addresses are added, and in the second cycle, the memory is accessed. Since at least two cycles are used to access the memory in a traditional processor, the cycle immediately following a load instruction cannot use the result of the load operation. This delay is referred to as "load latency." Load latency is a performance limitation factor in traditional processors. Load latency often manifests itself in a pipelined processor as a load-use penalty with the load results being unavailable for two machine cycles.

Accordingly, a need exists for an improved memory access circuit, system and method that addresses various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

A memory array access circuit is disclosed having a TAG circuit placed in parallel with an operand adder to allow first and second operands to directly access the TAG circuit and generate the way miss/hit signal without using the output sum of the operand adder which adds the first and second operands. With the parallel connection of the TAG and operand adder circuits, the operands (e.g., base and offset operands) are applied directly to the TAG circuit using an index CAM bitcell array to generate speculative way hit/miss information by first performing two speculative compares in two rows (one even, and one odd) and then generating two speculative hit/miss signals (even miss, and odd miss) which are selected under control of the least significant index bit computed from the first and second operands. To access rows in the CAM bitcell array, selected index bits from the first and second operands are encoded with propagate, generate, zero (PGZ) logic to generate a first set of PGZ values which are used to select a plurality of speculative indexed CAM word lines. At the same time, selected tag bits from the first and second operands are encoded with PGZ logic to generate a second set of PGZ values. In parallel with the PGZ operations, a carry value for the least significant bit of the selected tag bits is computed from the first and second operands by adding other bits in the first and second operands. In addition, a sum value corresponding to the least significant index bit is computed from selected bits in the first and second operands. The second set of PGZ values and the computed carry value are applied to generate a plurality of speculative hit/miss signals by designing each index CAM bitcell in the array to include embedded partial A+B=K compare logic so that the application of the second set of PGZ values and the computed carry value causes the selected CAM bitcells to perform both speculative indexed CAM look up (modified Read Word Line (RWL)) and a partial A+B=K compare operation, resulting in a plurality of possible memory array entry addresses. The computed sum value determines which of the plurality of speculative hit/miss signals is selected from the memory array.

Various illustrative embodiments of the present invention will now be described in detail with reference to the accompanying figures which illustrate functional and/or logical block components and various processing steps. It should be appreciated that such block components may be realized by any number of hardware, software, and/or firmware components configured to perform the specified functions. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected embodiments of the present invention are implemented, for the most part, with electronic components and circuits known to those skilled in the art, and as a result, circuit details have not been explained in any greater extent since such details are well known and not considered necessary to teach one skilled in the art of how to make or use the present invention. In addition, selected aspects are depicted with reference to simplified circuit schematics, logic diagrams, and flow chart drawings without including every circuit detail or feature in order to avoid limiting or obscuring the present invention. Such descriptions and representations are used by those skilled in the art to describe and convey the substance of their work to others skilled in the art.

Figure 1:
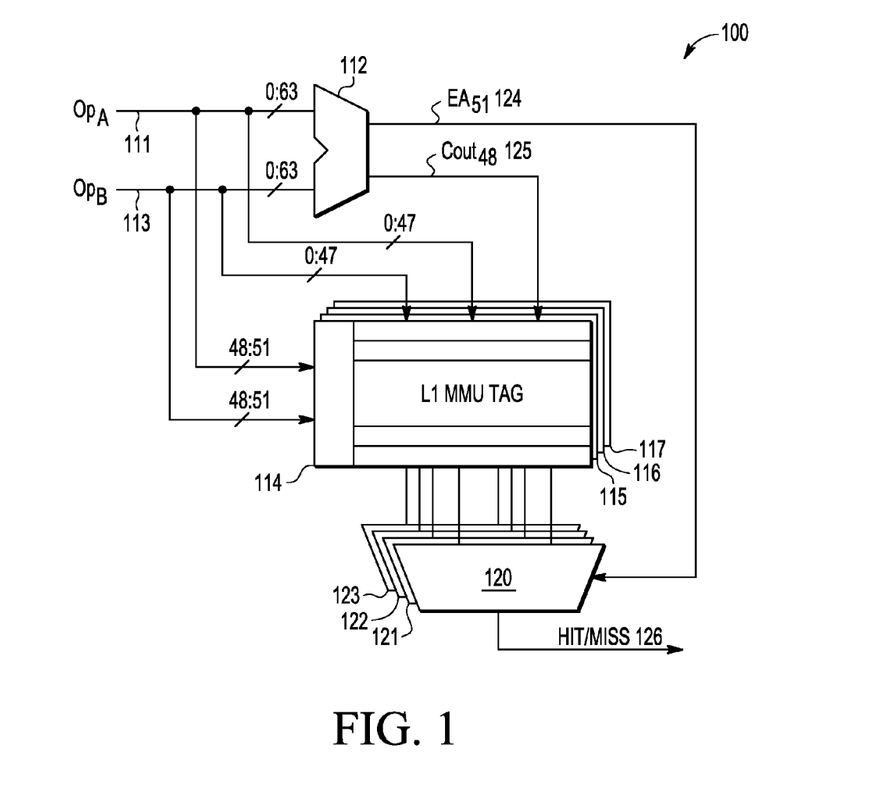
FIG. 1 is a simplified schematic block diagram of a fast L1 memory management unit (MMU) TAG circuit in accordance with selected embodiments of the invention.

Turning now to FIG. 1, there is depicted a simplified schematic block diagram of a multi-way L1 MMU TAG circuit 100 in accordance with selected embodiments of the invention. The depicted multi-way TAG circuit 100 receives two multi-bit operands 111, 113 ($OP_A$ and $OP_B$) and generates therefrom a hit/miss signal from each way by placing the L1 MMU TAG array(s) 114-117 in parallel to the operand adder circuit 112 in the pipeline stage. In operation, the hit/miss signal for each way is generated by accessing a speculative indexed CAM array 114-117 for each way with selected bits from the operands 111, 113 and then performing an index CAM operation using selected bits from the operands 111, 113 to generate speculative hit/miss information from each way. In support of this operation, the multi-way L1 MMU TAG circuit 100 includes an operand adder circuit 112 which is configured to add some or all of the bits (e.g., bits 0:63) from the two multi-bit operands 111, 113 ($OP_A$ and $OP_B$), including any required carry values (e.g., the carry out value from bit position 48) and sum values (e.g., the sum value from bit position 51) for one or more bit positions in the resulting sum. To avoid delay associated with waiting for the operand adder circuit 112 to compute the sum of the multi-bit operands 111, 113 ($OP_A$ and $OP_B$), selected operand bits are applied directly to the indexed CAM array for each way to generate speculative hit/miss information. For example, selected index bits (e.g., bits 48:51) from each operand 111, 113 are applied to a first speculative indexed CAM array 114 for way 0 to generate speculative indexed CAM wordlines from way 0, while selected tag bits (e.g., bits 0:47) from each operand 111, 113 and a computed carry-in value 125 for the least significant tag bit (e.g., $Cout_{48}$) are applied to the first speculative indexed CAM array 114 for way 0 to generate two (even and odd) speculative hit/miss signals 118, 119 from way 0. Under control of the computed sum value 124 for the least significant index bit, the selection or multiplexer circuit 120 selects the speculative hit/miss signal 126 for way 0.

Speculative hit/miss signal information may also be generated from other ways in accordance the multi-way embodiments disclosed herein. For example, selected index bits (e.g., bits 48:51) from each operand 111, 113 may also be applied to a second speculative indexed CAM array 115 to generate speculative indexed CAM wordlines from way 1, while selected tag bits (e.g., bits 0:47) from each operand 111, 113 and a computed carry-in value 125 for the least significant tag bit (e.g., $Cout_{48}$) are applied to the second speculative indexed CAM array 115 to generate two (even and odd) speculative hit/miss signals from way 1 which are selected under control of the computed sum value 124 by the selection/multiplexer circuit 121 for output as the speculative hit/miss signal 126 for way 1. Likewise, additional dedicated CAM arrays 116-117 and selection/multiplexer circuits 122-123 may be provided for each additional way.

Figure 2:
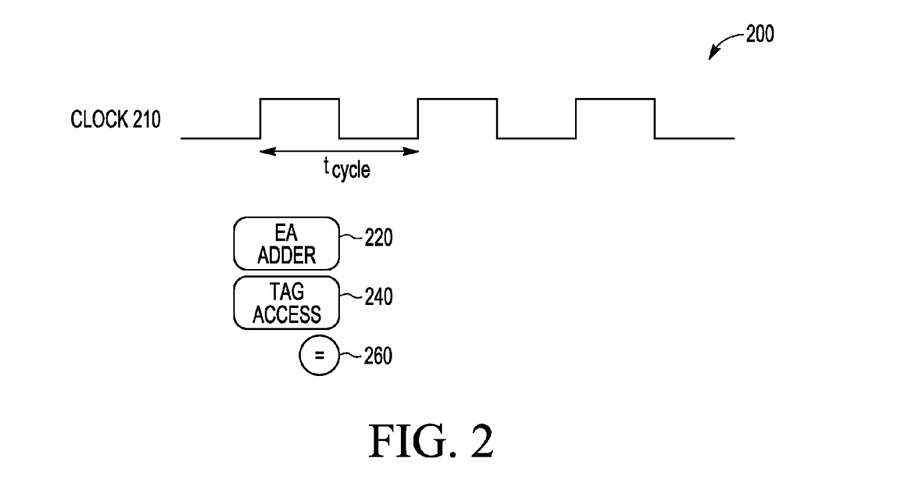
FIG. 2 is a timing diagram illustrating the computation of the effective address in parallel with the computation of the TAG and data access and the selection of the hit/miss information to reduce the load-store path delay associated with L1 cache access.

With the disclosed L1 MMU TAG circuit, memory access speeds are improved over conventional memory address schemes which use two or more cycles to compute an effective address by adding a base and offset address (using a first cycle) and then use the effective address to access the memory with the effective address (using a second cycle). In contrast, the L1MMU TAG lookup and generation of way hit/miss information as disclosed herein is faster since, in the L1 MMU TAG circuit, the operands are used to directly access the tag array to generate hit/miss information, thereby reducing load latency in the load-store timing path. The reduced latency is depicted in FIG. 2 which illustrates a timing diagram 200 showing how the computation of the effective address (EA operation 220) in parallel with the computation of the TAG and data access (tag access operation 240) and the selection of the hit/miss information ("=" operation 260) all occur within a single cycle ($t_{cycle}$) of the clock 210, thereby reducing the load-store path delay associated with conventional L1 cache access which can require two or more clock cycles.

Figure 3:
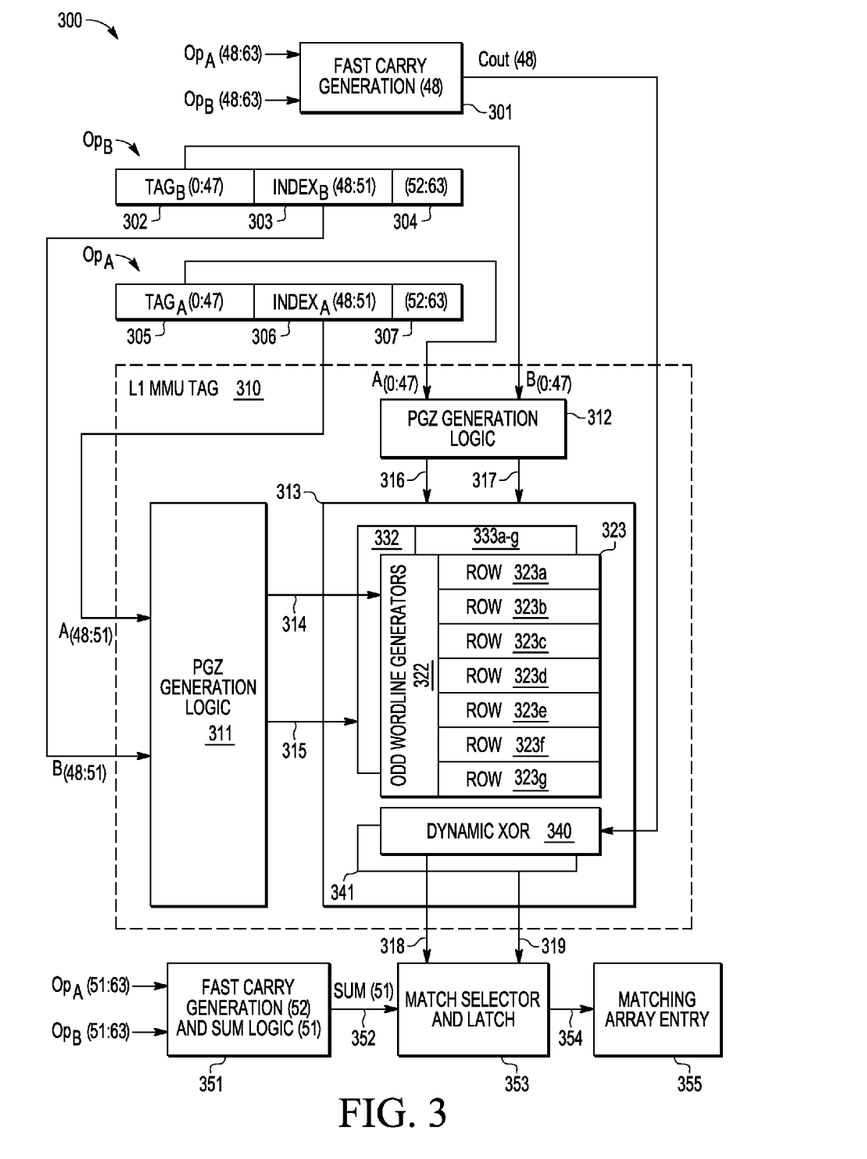
FIG. 3 is a simplified schematic block diagram of a TAG lookup and hit/miss generation circuit which is speculatively accessed by two operands in accordance with of the selected embodiments of the invention.

FIG. 3 is a simplified schematic block diagram of a data processing system 300 in which a TAG lookup and hit/miss generation circuit 310 which is speculatively accessed by two operands ($OP_A$ and $OP_B$) to perform a staged comparison with speculative indexed CAM arrays to generate a speculative miss signal in accordance with selected embodiments of the invention. In selected embodiments, one of the operands (Operand A) provides the "base" address and the other operand (Operand B) provides the "offset" address such that the base and offset addresses are used to generate the "effective" address of the memory entry. However, instead of using the effective address to generate a miss signal, selected index bits in the operands $OP_A$, $OP_B$ are used to speculatively access a plurality of indexed CAM wordlines. In selected embodiments where index bits 48 through 51 are used, bit 48 may be the most-significant-bit (MSB) and bit 51 may be the least-significant bit (LSB) of the index bits, though the significance of the bits might be reversed so that the higher-numbered bit is more significant than the lower-numbered bit.

In any event, the selected index bits 306, 303 from operands $OP_A$ and $OP_B$ may be provided as memory address bits to the PGZ generation logic 311 which combines pairs of bits using logical operators (e.g., NOT, XOR, OR, AND, NAND) to create propagate, generate, zero (PGZ) logic values 314, 315 that are provided to the L1 MMU tag array 313. In the example shown, four bits ($A_{(48:51)}$, $B_{(48:51)}$) are provided to the PGZ generation logic 311 from each of the first and second operands $OP_A$, $OP_B$ to generate PGZ values in the form of two speculative addresses 314, 315. Based on the index bits 306, 303 from operands $OP_A$ and $OP_B$, the PGZ generation logic 311 generates PGZ values from each index bit pair which may include a Propagate value (by XORing the input bit pair), a Generate value (by ANDing the input bit pair), and a Zero value (by ANDing the inverted input bit pair). In addition, complementary $\overline{P}$ and $\overline{G}$ values may be generated, with $\overline{P}$ being the inverse of the XOR value (by XNORing the input bit pair), and with $\overline{G}$ being the inverse of the AND value (by NANDing the input bit pair). As will be appreciated, the logical operations may be performed with equivalent circuitry and are not necessarily performed with AND and XOR logic gates.

The PGZ values 314, 315, in turn, are provided to copies of wordline generators 322, 332 in order to access a memory entry from the odd and even memory arrays. As a result of running the PGZ values 314, 315 through the wordline generators 322, 332, respectively, one of the odd wordlines 323a-g will be enabled and one of the even wordlines 333a-g will be enabled. In this way, the PGZ values 314 are processed by a plurality of odd wordline generators 322 to generate one possible odd memory array address in the odd array 323a-g, while the PGZ values 315 are processed by a plurality of even wordline generators 332 to generate one possible even memory array address in the even array 333a-g.

In parallel with the PGZ generation logic 311, selected tag bits 305, 302 from operands $OP_A$ and $OP_B$ are provided as memory address bits to the PGZ generation logic 312 which generates PGZ logic values 316, 317 from the tag bits 0 through 47. In the example shown, tag bits $A_{(0:47)}$, $B_{(0:47)}$ are provided to the PGZ generation logic 312 from each of the first and second operands $OP_A$, $OP_B$ to generate PGZ values 316, 317. In addition, fast carry generation logic 301 processes bits 48 through 63 from operands $OP_A$ and $OP_B$ to compute a carry value for the least significant bit of the tag bits (e.g., carry out Cout (48) from bit position 48). By providing the PGZ values 316, 317 to index CAM bitcells in the odd and even arrays 323, 333, two speculative miss (even miss and odd miss) signals 318, 319 are generated through the dynamic XOR blocks 340, 341 for the even and odd arrays under the control of the computed carry value Cout (48).

In parallel with memory array access operations through the PGZ values, fast carry generation and sum logic 351 processes selected bits 304, 307 (e.g., bits 52 through 63) from operands $OP_A$ and $OP_B$ to compute a carry value for the least significant bit of the index bits (e.g., carry out Cout (52) from bit position 52). In addition, the carry value is added to the LSB of the memory address bits of the Operands A and B. This results in sum value 352 (and possibly its complement) for the LSB of the memory address bits (e.g., least significant index bit 51). The sum value 352 is applied to the match selector and latch 353 to control the selection of either the possible odd memory array entry address 318 or the possible even memory array entry address 319, depending on the computed sum value 352. The selected memory array address 354 is then retrieved from memory array 355.

Figure 4:
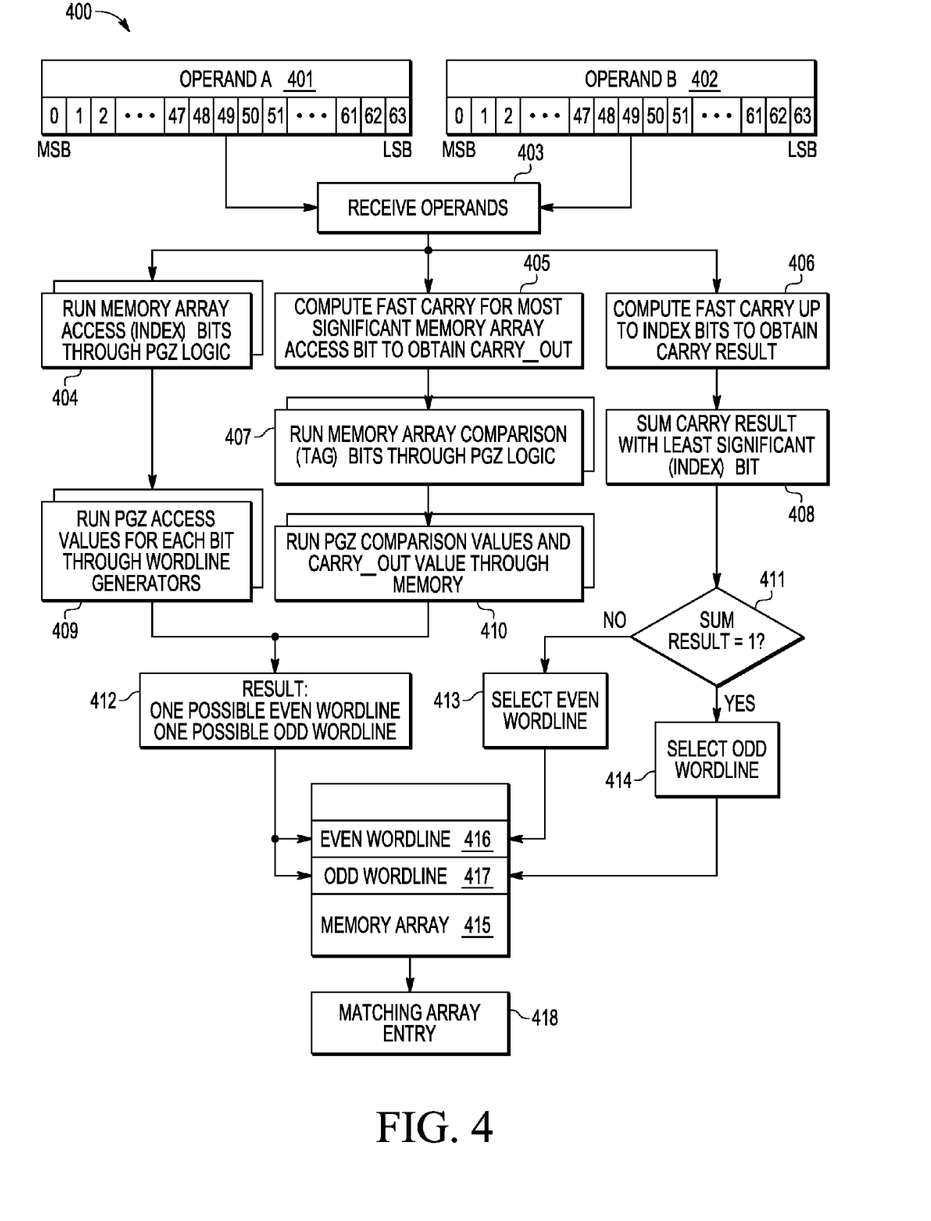
FIG. 4 is a high level flowchart of the steps for using two operands to speculatively access a TAG circuit to generate hit/miss information.

Turning now to FIG. 4, there is illustrated a high level flowchart 400 of the steps for using two operands to speculatively access a TAG circuit to generate hit/miss information. Operand A 401 and Operand B 402 each include a plurality of bits, some of which are used to address a memory entry in a memory array. In an example embodiment, each operand includes 64 bits numbered 0 to 63, where bit 0 is the most significant bit, and bit 63 is the least significant bit. As described herein, selected index bits in the operands (e.g., bits 48 through 51) are used to speculatively access a plurality of possible memory array entry addresses in even and odd arrays, while selected tag bits in the operands (e.g., bits 0 through 47) are used with a carry out value for the most significant index bit are used to generate two speculative miss (even miss and odd miss) signals. Again, while bit 0 is the most-significant-bit (MSB) and bit 63 is the least-significant-bit (LSB), the significance of the bits might be reversed so that the higher-numbered bit is more significant than the lower-numbered bit.

At step 403, Operand A 401 and Operand B 402 are received. In the example shown, Operand A 401 may represent a "base" address and the Operand B 402 may represent an offset address, where the base and offset addresses are used to generate an "effective" address of the memory entry. Instead of adding Operand A 401 and Operand B 402 with an adder circuit, three parallel processes commence at this point. A first process evaluates index address bits (e.g., bits 48 through 51) to arrive at two possible wordlines (as used herein, a "wordline" is an address of an entry in the memory array or an actual memory array entry, as the context indicates). A second process evaluates tag address bits (e.g., bits 0 through 47) and a computed carry value for the least significant tag bit to arrive at two possible speculative miss signals (as used herein, a "miss" signal can be considered a "hit" signal, depending on the polarity of the logic and as the context indicates). A third process determines if a carry results from bits in the operands (e.g., bits 52 through 63) and adds the carry value to the LSBs of the bits of the Operand A and B used to address the memory entry. The summation value determines which of the possible speculative miss signals is the actual miss signal.

In the first parallel process, the memory access index bits for accessing the memory array (e.g., bits 48 through 51 for both Operands A and B) are run through PGZ generation logic at step 404. PGZ generation logic combines pairs of bits using logical operators (XOR, OR, AND, NAND) to create PGZ values for each of the memory access index bits from each operand. As indicated by the cascaded blocks at step 404, PGZ values are generated for each index bit from each operand. Thus, four bits are provided from each operand (Operands A and B) as base and offset addresses to generate a four bit effective address from each operand by generating PGZ values for the MSBs (bit 48 from both operands), bit 49 from both operands, bit 50 from both operands and from the LSBs (bit 51 from both operands). Each effective address generated at step 404 can be used to access a memory entry from a multi-entry memory array at step 409 by running the PGZ access values for each bit through wordline generators. As described with reference to FIG. 3, multiple copies of the wordline generators may be used, depending on the size of the memory array being accessed. For example, with a sixteen-entry memory array, sixteen copies of the wordline generators are used (eight copies of the odd wordline generator 322 and eight copies of the even wordline generator 332).

In the second parallel process, tag address bits (e.g., bits 0 through 47) and a fast carry value for the least significant tag bit are evaluated to arrive at two possible speculative miss signals. The process begins at step 405 by performing a fast carry computation for bits 48 through 63 for both operands A and B, thereby generating the carry out value (Carry_Out) for the most significant memory array access (index) bit (e.g., bit 48). In addition, the memory array comparison (tag) bits (e.g., bits 0 through 47 for both Operands A and B) are run through PGZ generation logic at step 407. At step 410, the PGZ comparison values (generated at step 407) and the computed carry out value (Carry_Out) are run through the odd and even indexed CAM arrays.

At step 412, the results of the wordline generators (from step 409) and the odd and even indexed CAM arrays (from step 410) are received. The results of running the PGZ values through the wordline generators and indexed CAM arrays are one possible even wordline (with 0 being considered an even wordline, i.e., 0, 2, 4, 6, 8, 10, 12, and 14) and one possible odd wordline (i.e., 1, 3, 5, 7, 9, 11, 13, 15). In the example shown, even wordline 416 and odd wordline 417 have been identified as the possible wordlines within memory array 415.

The reason that there are two wordline possibilities is that there may be a carry resulting from the operand bits that are less significant than the memory array access (index) bits. To resolve this uncertainty, the third parallel process is undertaken to select between the even and odd wordlines 416, 417. As illustrated, the third process begins at step 406 by performing a fast carry computation up to (but not including) the least significant memory array access (index) bit (e.g., for bits 52 through 63) for both Operands A and B. In step 408, the carry result value generated in step 406 is summed (added) to the least-significant memory array access (index) bits (e.g., bit 51) of the Operands A and B. A determination is made at step 411 as to whether the sum operation results in a "1" or a "0". If the sum operation results in a "0" (negative outcome to decision step 411), the even wordline 416 is selected (step 413). On the other hand, if the sum operation results in a "1" (affirmative outcome to decision step 411), the odd possible wordline 417 is selected (step 414). At step 418, the selected wordline is retrieved from memory array 415.

Figure 5:
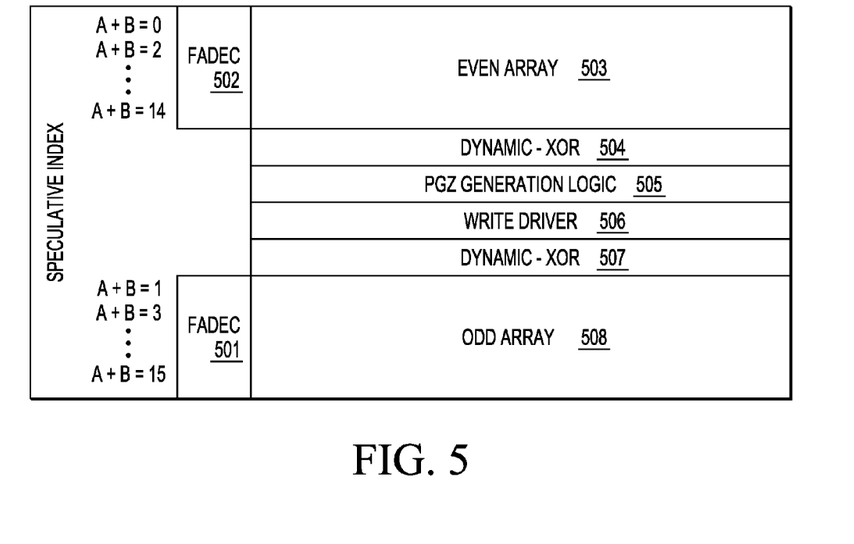
FIG. 5 is a simplified schematic block diagram of an L1 TAG array which uses fast address decoders and PGZ generation logic to generate speculative miss signals from the even and odd arrays and dynamic XOR logic blocks which are selected by the least significant index bit value in accordance with selected embodiments of the invention.

Turning now to FIG. 5, there is depicted a simplified schematic block diagram of an L1 TAG array 500 which uses fast address decoders 501, 502 and PGZ generation logic 505 to generate speculative miss signals from the even and odd arrays 503, 508 and dynamic XOR logic blocks 504, 507 which are selected by the least significant index bit value. As depicted, selected bits (e.g., index bits 48:51) from each operand are used for speculative access of the even and odd rows in the even array 503 and odd array 508, respectively. For example, if the L1 TAG array 500 has sixteen memory array entries, the rows in the even array 503 store eight even K=A+B values (e.g., A+B=0, A+B=2, ... A+B=14), while the rows in the odd array 508 store eight odd K=A+B values (e.g., A+B=1, A+B=3, ... A+B=15). Using the selected index bits (e.g., bits 48:51) from Operands A and B, the fast address decoders 501, 502 speculatively access the rows in the even and odd arrays 503, 508.

At the same time, selected tag bits (e.g., bits 0:47) from Operands A and B are applied to the PGZ generation logic 505 to generate PGZ comparison values. As will be appreciated, the PGZ generation logic 505 may be shared across multiple ways (e.g., 2 or 4), and is used to generate a propagate bit ($P_i = A_i \otimes B_i$) and its complement $\overline{P}_i$, a generate bit ($G_i = A_i \cdot B_i$) and its complement $\overline{G}_i$, and a zero bit ($Z_i = \overline{A}_i \cdot \overline{B}_i$) and its complement $\overline{Z}_i$. The PGZ comparison values for each bit position are applied to A+B=K indexed CAM cells in the even and odd arrays 503, 508 to generate required carry in and produced carry out values, thereby implementing a two-stage comparison of the operand bit values $A_i$, $B_i$ and the stored $K_i$ values in the array. In the first comparison stage, the PGZ comparison values generated by the PGZ generation logic 505 are applied to A+B=K indexed CAM cells from the speculatively accessed even and odd rows in the even and odd arrays 503, 508. In the second comparison stage, the required carry in and produced carry out values output from the A+B=K indexed CAM cells in the even and odd arrays 503, 508 are applied to the dynamic XOR logic 504, 507. As explained more fully below, the dynamic XOR logic 504, 507 effectively performs a speculative comparison on the two speculatively accessed rows to generate two speculative miss signals (output=1) or speculative hit signals (output=0), depending on the polarity and logic used. Using additional combinatorial logic circuitry (not shown), the speculative even and odd hit/miss signals may be logically combined with a sum value for the least significant index bit to select between the speculative even and odd hit/miss signals.

Figure 6:
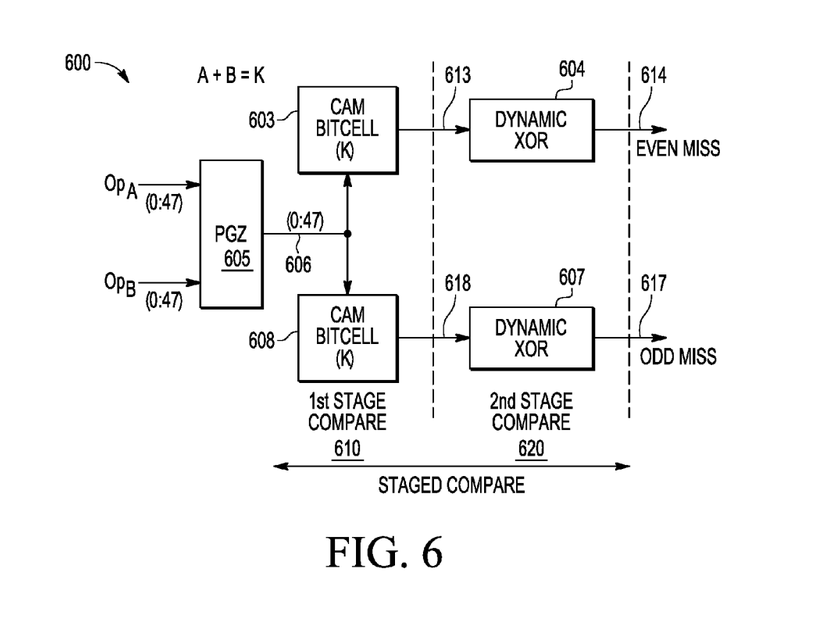
FIG. 6 is a simplified circuit schematic block diagram of the staged compare operation of the A+B=K indexed CAM bitcells which generate speculative even and odd MISS signals for selection by the last significant bit of an index address in accordance with selected embodiments of the invention.

For additional detail, reference is now made to FIG. 6 which depicts a simplified circuit schematic block diagram 600 of the staged compare operation of the A+B=K indexed CAM bitcells to generate speculative even and odd MISS signals for selection by the last significant bit of an index address. As depicted, selected bits (e.g., bits 0:47) from Operands A and B are applied to the PGZ generation logic 605 to generate PGZ comparison values 606 for each of the selected bits for purposes of implementing a K=A+B comparator. In a first comparison stage 610, the PGZ comparison values 606 are applied to the even and odd indexed CAM bitcells 603, 608 which each include logic circuitry for performing a partial A+B=K comparison operation to generate required carry in and produced carry out values 613, 618. In the second comparison stage 620, the required carry in and produced carry out values 613, 618 from the even and odd arrays are applied to the corresponding dynamic XOR logic 604, 607 which effectively performs two speculative compares on the two speculatively accessed rows to generate two speculative miss signals 614, 617, respectively.

Figure 7:
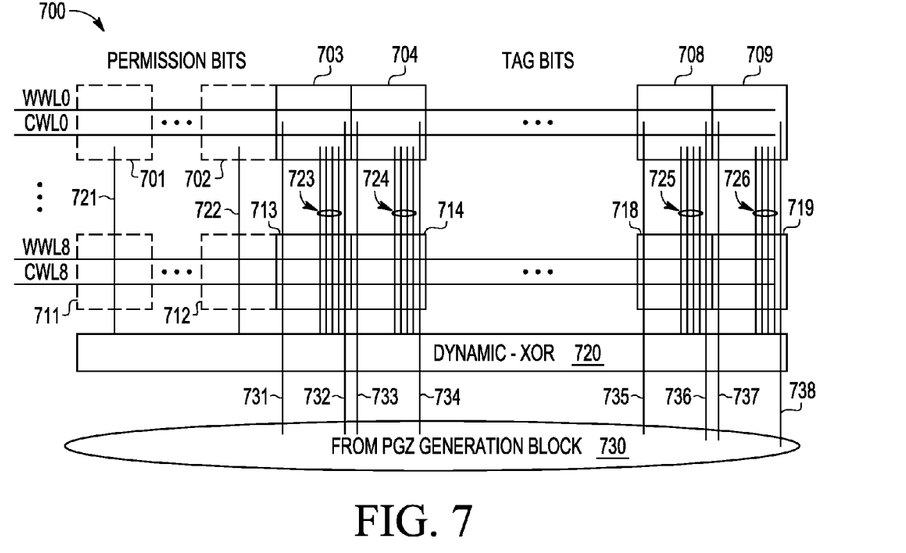
FIG. 7 is a simplified schematic block diagram of an L1 TAG array with permission bits and tag bits in accordance with selected embodiments of the invention.

To illustrate selected embodiments in which indexed CAM cells are arranged in rows with associated permission bitcells, FIG. 7 depicts a simplified schematic block diagram of an L1 TAG array 700 with permission bits and tag bits arranged in rows and columns in accordance with selected embodiments of the invention. The depicted array 700 stores "even" K values (e.g., A+B=0, A+B=2, ... A+B=8), while another array (not shown) stores "odd" K values. In particular, the array 700 includes a first even row (e.g., Row 0) in which a plurality of permission bits 701-702 and tag bits 703-709 share a common write wordline (WWL0) and compare wordline (CWL0). Additional even rows are included, such as a last even row (e.g., Row 8) in which a plurality of permission bits 711-712 and tag bits 713-719 share a common write wordline (WWL8) and compare wordline (CWL8).

As described herein, each of the tag bits (e.g., 703-709, 713-719) may be implemented as an indexed CAM bitcell which includes logic circuitry for performing a partial A+B=K comparison operation in response to computed PGZ values. Thus, "even" tag bit 703 receives PGZ values 731 and/or complementary PGZ values 732 from PGZ generation block 730. Upon application of the PGZ values 731, 732, the logic circuitry in the tag bit 703 generates carry values 723 which are provided to the dynamic XOR circuit block 720. In similar fashion, each of the remaining tag bits 704-709 in the first row receives a corresponding pair of PGZ values (e.g., 733/734, 735/736, 737/738) and generates corresponding carry values 724-726 which are provided to the dynamic XOR circuit block 720 (as indicated), and the same design and operation are used for the other tag bits in other rows (e.g., tag bits 713-719).

The permission bits 701-702, 711-712 for each row are used as "valid" or "status" bits to control the hit/miss signal generated by a given row. Because the permission bits are known beforehand, there is no need to perform speculative comparison with operand bits, so PGZ values are not provided to the permission bits by the PGZ generation block 730. The permission bits (e.g., 701, 702) associated with a row (e.g., Row 0) each operate to provide a "valid" bit function so that, if the permission bit is set to "zero" (indicating "not valid), there will be a MISS produced even if there is a match otherwise indicated by the memory address portion (bits 0:51) from Operands A and B.

Figure 8:
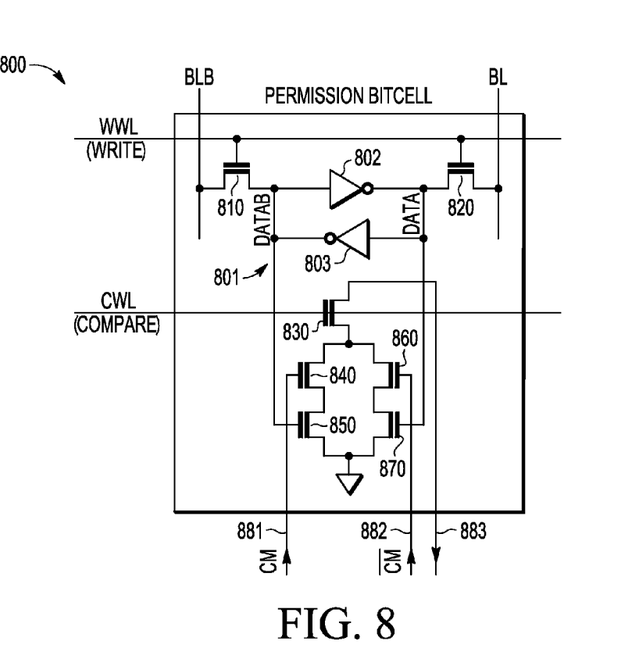
FIG. 8 is a circuit schematic diagram of a permission bitcell in accordance with selected embodiments of the invention.

An example embodiment of the permission bitcell design is shown with the circuit schematic diagram shown in FIG. 8. As depicted, the depicted permission bitcell 800 includes a memory unit 801 of two inverters 802, 803 cross-coupled between first and second data nodes (DATA and DATAB). The first and second data nodes are connected across access transistors 820, 810 to a shared bit line pair BL, BLB. Write access to the permission bitcell 800 is controlled by a write word line (WWL) that is applied to the gates of the access transistors 810, 820. In addition, a comparison circuit is connected between the data nodes for generating a permission output signal 883 in response to first and second control signals (CM, $\overline{CM}$) and a compare wordline (CWL) signal for the permission bitcell (row). The comparison circuit includes a first pair of series-connected transistors 840, 850 coupled in parallel with a second pair of series-connected transistors 860, 870 between a connection transistor 830 and a reference supply voltage (e.g., ground). As depicted, the first and second data nodes (DATA and DATAB) are connected, respectively, to the gates of the transistors 870, 850, and the first and second control signals (CM, $\overline{CM}$) are connected, respectively, to the gates of the transistors 840, 860. In addition, the connection transistor 830 connects the pair of series-connected transistors 840, 850, 860, 870 to the permission output signal 883, with the compare wordline (CWL) signal connected to the gate of the connection transistor 830. In this example, a logical "zero" stored in the data node DATA will generate a logical "zero" as the permission output signal 883 when the first and second control signals are set at CM=1 and $\overline{CM}$=0.

Figure 9:
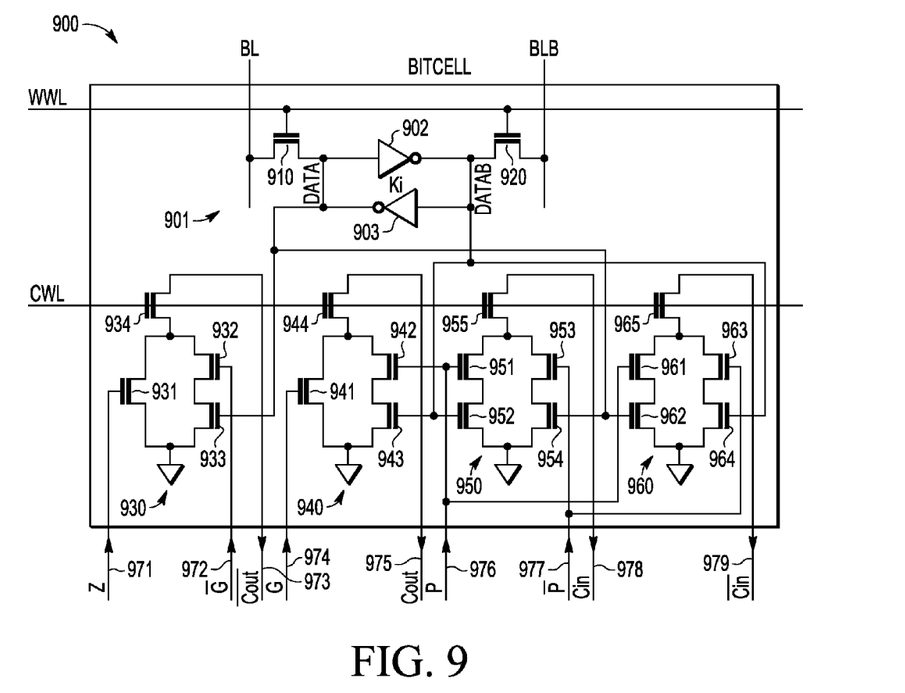
FIG. 9 is a circuit schematic diagram of a tag bitcell with partial A+B=K logic in accordance with selected embodiments of the invention.

Turning now to FIG. 9, there is depicted a circuit schematic diagram of a tag bitcell 900 with partial A+B=K logic in accordance with selected embodiments of the invention. As depicted, the depicted tag bitcell 900 includes a memory unit 901 of two inverters 902, 903 cross-coupled between first and second data nodes (DATA and DATAB). The first and second data nodes are connected across access transistors 910, 920 to a shared bit line pair BL, BLB. Write access to the tag bitcell 900 is controlled by a write word line (WWL) that is applied to the gates of the access transistors 910, 920. In addition, embedded partial A+B=K comparison logic circuitry is connected to the data nodes for generating carry values 973, 975, 978, 979 in response to PGZ values (P, $\overline{P}$, G, $\overline{G}$, Z) and a compare wordline (CWL) signal for the tag bitcell (row).

As depicted, the embedded comparison logic circuitry includes a first logic circuit 930 in which a first transistor 931 is coupled in parallel with a pair of series-connected transistors 932, 933 between a connection transistor 934 and a reference supply voltage (e.g., ground). As depicted, a Zero (Z) value 971 generated by the PGZ generation logic is connected to the gate of the first transistor 931, a complementary Generate ($\overline{G}$) value 972 generated by the PGZ generation logic is connected to the gate of the transistor 932, and the first data node DATA is connected to the gate of the transistor 933. In addition, the connection transistor 934 connects the first logic circuit 930 to output the complementary carry-out value $\overline{C_{out}}$ 973, with the compare wordline (CWL) signal connected to the gate of the connection transistor 934.

The embedded comparison logic circuitry also includes a second logic circuit 940 in which a first transistor 941 is coupled in parallel with a pair of series-connected transistors 942, 943 between a connection transistor 944 and a reference supply voltage (e.g., ground). As depicted, a Generate (G) value 974 generated by the PGZ generation logic is connected to the gate of the first transistor 941, a Propagate (P) value 976 generated by the PGZ generation logic is connected to the gate of the transistor 942, and the second data node DATAB is connected to the gate of the transistor 943. In addition, the connection transistor 944 connects the second logic circuit 940 to output the carry-out value $C_{out}$ 975, with the compare wordline (CWL) signal connected to the gate of the connection transistor 944.

In addition, the embedded comparison logic circuitry includes a third logic circuit 950 in which a first pair of series-connected transistors 951, 952 is coupled in parallel with a second pair of series-connected transistors 953, 954 between a connection transistor 955 and a reference voltage (e.g., ground). As depicted, the Propagate (P) value 976 generated by the PGZ generation logic is connected to the gate of the transistor 951, the second data node DATAB is connected to the gate of the transistor 952, the complementary Propagate ($\overline{P}$) value 977 generated by the PGZ generation logic is connected to the gate of the transistor 953, and the first data node DATA is connected to the gate of the transistor 954. In addition, the connection transistor 955 connects the third logic circuit 950 to output the carry-in value $C_{in}$ 978, with the compare wordline (CWL) signal connected to the gate of the connection transistor 955.

Finally, the embedded comparison logic circuitry includes a fourth logic circuit 960 in which a first pair of series-connected transistors 961, 962 is coupled in parallel with a second pair of series-connected transistors 963, 964 between a connection transistor 965 and a reference supply voltage (e.g., ground). As depicted, the Propagate (P) value 976 generated by the PGZ generation logic is connected to the gate of the transistor 961, the first data node DATA is connected to the gate of the transistor 962, the complementary Propagate ($\overline{P}$) value 977 generated by the PGZ generation logic is connected to the gate of the transistor 963, and the second data node DATAB is connected to the gate of the transistor 964. In addition, the connection transistor 965 connects the third logic circuit 960 to output the complementary carry-in value $\overline{C_{in}}$ 979, with the compare wordline (CWL) signal connected to the gate of the connection transistor 965.

Using the embedded comparison logic circuitry, the tag bitcell 900 can be used to determine if the address Operands A and B correspond to the stored K value by evaluating the "A+B=K" conditions without carry propagation that would be required by adding the Operands A and B. This evaluation requires only that, knowing A and B, one also knows what the carry into each bit must be if K=A+B. With this approach, only the adjacent pairs of bits need to be checked to verify that the previous bit produces the carry required by the current bit, and then a "ones" detector can be used to check that the condition is true for all N pairs. Specifically, if K=A+B for bitcell i, the required carry-in value ($C_{ini}$ Required=$A_i \otimes B_i \otimes K_i$) must match the produced carry-out value from bitcell i-1 ($C_{outi-1}$ Produced=$(A_{i-1} \otimes B_{i-1}) \cdot \overline{K}_{i-1} + A_{i-1} \cdot B_{i-1}$). Conversely, if carry-in value ($C_{ini}$ Required) does not match the produce a carry-out value ($C_{outi-1}$ Produced), then a miss is indicated. The bitcell i−1 is the adjacent less significant bit of bitcell i.

To support the embedded comparison logic circuitry, the tag bitcell 900 receives PGZ values from the PGZ generation logic. In the example embodiment shown in FIG. 9, the tag bitcell 900 receives a Zero bit 971 ($Z_i = \overline{A}_i \cdot \overline{B}_i$), a Generate bit 974 ($G_i = A_i \cdot B_i$) and a Not Generate bit 972 ($\overline{G}_i = \overline{A}_i + \overline{B}_i$), a Propagate bit 976 ($P_i = A_i \otimes B_i$) and a Not Propagate bit 977 ($\overline{P}_i = A_i \odot B_i$). In this way, the carry values generated by the tag bitcell 900 include a first required carry-in value 978 (e.g., $C_{ini}$ Required=$A_i \otimes B_i \otimes K_i$) and a first produced carry-out value 975 (e.g., $C_{outi}$ Produced=$(A_i \otimes B_i) \cdot \overline{K}_i + A_i \cdot B_i$). In ⊗ addition, complementary versions of the required carry in value ($\overline{C_{ini}}$) 979 and produced carry out value ($\overline{C_{outi}}$) 973 may also be generated. The generated carry values 973, 975, 978, 979 from tag bitcell 900 are provided to the dynamic XOR circuit block which determines if there is a match or HIT between the required carry-in value for the tag bit (e.g., 900) (e.g., $C_{ini}$ Required) and the first produced carry-out value for the adjacent, less significant tag bit (e.g., $C_{outi-1}$). Stated another way, the dynamic XOR circuit block determines if there is a MISS when the required carry-in value for the tag bit (e.g., 900) (e.g., $C_{ini}$ Required) does not match the first produced carry-out value for the adjacent, less significant tag bit (e.g., $C_{outi-1}$).

Figure 10:
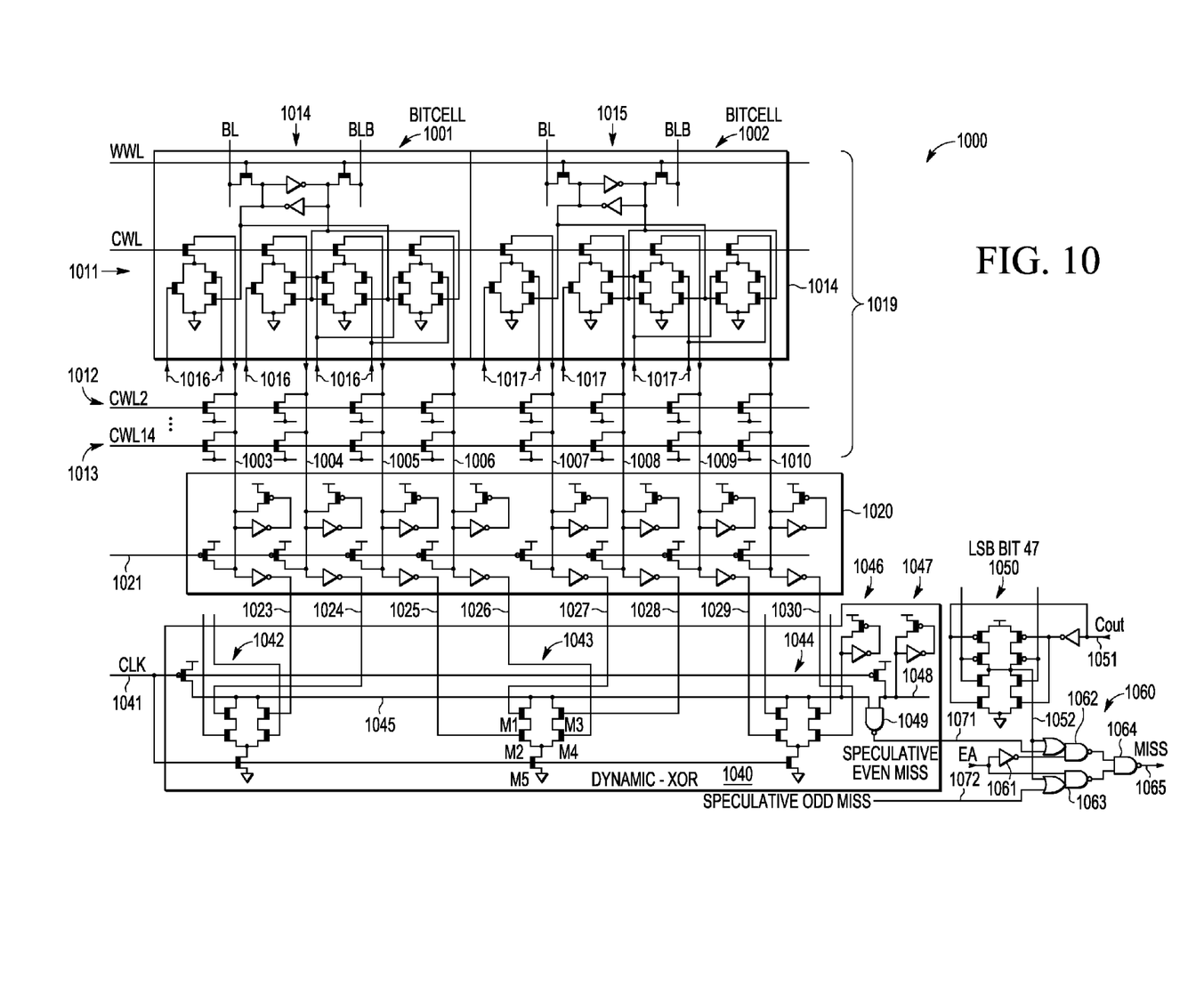
FIG. 10 is a circuit schematic diagram depicting TAG bit column logic in an even array in accordance with selected embodiments of the invention.

To illustrate how the tag bitcells are arrayed and processed to identify a speculative miss signals for selection by the least significant bit of the index address bits, reference is now made to FIG. 10 which depicts a circuit schematic diagram of the TAG bit column logic 1000 in an even array 1019 in accordance with selected embodiments of the invention. The depicted array 1019 includes a plurality of tag bitcells (e.g., 1001, 1002) arranged in a plurality of rows 1011, 1012, 1013 and columns 1014, 1015. Each bitcell (e.g., 1001, 1002) may use substantially the same design and operation as shown in FIG. 9 so to include embedded partial A+B=K comparison logic circuitry for generating carry values (e.g., 1003-1006, 1007-1010) in response to PGZ values (e.g., 1016, 1017) and a compare wordline (CWL) signal for the tag bitcell. For example, bitcell 1001 receives PGZ values (Z, G, $\overline{G}$, P, and $\overline{P}$) at input lines 1016, and outputs $\overline{C_{out}}$ line 1003, $C_{out}$ at line 1004, $C_{in}$ at line 1005, and $\overline{C_{in}}$ at line 1006.

The generated carry values (e.g., 1003-1006) are applied to the bitline driver output circuit block 1020 which is controlled by the precharge signal line 1021. Each carry value line is coupled to a keeper pull-up circuit for driving logical "one" values to a predetermined reference voltage (e.g., Vdd) by coupling the carry value line across a first pull-up transistor (e.g., PMOS transistor) to the predetermined reference voltage, where the first pull-up transistor is gated by an inverter which is coupled between the carry value line and the first pull-up transistor. In addition, each carry value line is coupled across a second pull-up transistor (e.g., PMOS transistor) to a predetermined reference voltage (e.g., Vdd) when the precharge signal line 1021 has a first logical state (e.g., "zero" volts). However, when the precharge signal line 1021 has a second logical state (e.g., "one" volt), the second pull-up transistor is not conductive, and the carry values 1003-1010 are each applied to a corresponding inverter circuit for purposes of generating inverted carry values 1023-1030. Thus, carry values 1003-1006 from bitcell 1001 become inverted carry values 1023-1026. Likewise, carry values 1007-1010 from bitcell 1002 become inverted carry values 1027-1030.

The inverted carry values (e.g., 1027-1030) are applied to the dynamic XOR logic circuit block 1040 which is controlled by the clock signal 1041 to generate a speculative miss signal 1071 from the even array 1019 if any of the stored K values in the tag bitcells from the accessed row do not match the corresponding Operand A and B values. In operation, the dynamic XOR logic circuit block 1040 dynamically compares the required carry-in value for each tag bitcell in a selected row with the produced carry-out value from the adjacent, less significant tag bitcell. If any of the tag bitcells in a row from the even array 1019 have a required carry-in value that does not match the produced carry-out value from the adjacent, less significant tag bitcell, the dynamic XOR logic circuit block 1040 generates a speculative even miss signal 1071 having a first logical state (e.g., logical "one"). Similarly, if any of the tag bitcells in a row from the odd array (not shown) have a required carry-in value that does not match the produced carry-out value from the adjacent, less significant tag bitcell, the dynamic XOR logic circuit block for the odd array (not shown) generates a speculative odd miss signal 1072 having a first logical state (e.g., logical "one").

To dynamically compare the carry values, the dynamic XOR logic circuit block 1040 includes a plurality of match circuits 1042, 1043, 1044, etc. Each match circuit may be implemented as an XNOR logical function at the output dynamic node 1045 based on inputs from the required carry-in value for a given tag bitcell with the produced carry-out value from the adjacent, less significant tag bitcell. For example, the dynamic XOR logic circuit block 1040 includes a match circuit 1043 which includes a first pair of series-connected transistors M1, M2 coupled in parallel with a second pair of series-connected transistors M3, M4 between the dynamic node 1045 and a reference voltage connection transistor M5. As depicted, the $C_{out}$ value from bitcell 1002 (by virtue of inversion at the bitline driver output circuit block 1020) is connected to the gate of the first transistor M1, the $\overline{C_{in}}$ value from bitcell 1001 (by virtue of inversion at the bitline driver output circuit block 1020) is connected to the gate of the second transistor M2, the $\overline{C_{out}}$ value from bitcell 1002 (by virtue of inversion at the bitline driver output circuit block 1020) is connected to the gate of the third transistor M3, and the $C_{in}$ value from bitcell 1001 (by virtue of inversion at the bitline driver output circuit block 1020) is connected to the gate of the fourth transistor M4. In addition, the reference voltage connection transistor M5 connects the pair of series-connected transistors M1-M4 to the predetermined reference voltage (e.g., ground), with the clock signal 1041 connected to the gate of the reference voltage connection transistor M5. In this example, a logical "zero" will be generated at the dynamic node 1045 by the match circuit 1043 if the $C_{out}$ line 1027 and the $C_{in}$ line 1026 do not match. However, if there is a match, the match circuit 1043 will output a logical "one" at the dynamic node 1045.

As depicted, the plurality of XNOR match circuits 1042, 1043, 1044 are connected in parallel to the dynamic node 1045 which in turn is connected to a first pull-up circuit 1046. By connecting the dynamic node 1045 as a first input to the NAND gate circuit 1049 which has its other input 1048 held to a logical "one" by the pull-up circuit 1047, the resulting output 1071 from the NAND gate 1049 will signal a speculative miss (e.g., logical value "zero") from the even array 1019 if any of the match circuits 1042, 1043, 1044 indicate that $C_{outi-1}$ does not match $C_{ini}$. Conversely, the output 1071 from the NAND gate 1049 will signal a speculative hit (e.g., logical value "one") from the even array 1019 only if all of the match circuits 1042, 1043, 1044 on a selected row indicate that $C_{outi-1}$ matches $C_{ini}$.

While the dynamic XOR logic circuit block 1040 dynamically compares the produced $C_{out}$ from the adjacent less significant bit and required $C_{in}$ values for each bit positions in 0:46, a static XOR logic circuit 1050 may be used to generate an XOR output 1052 between the produced $C_{out}$ value of bit 48 1051 and the required $C_{in}$ value for LSB 47. In an example embodiment shown in FIG. 10, the static XOR logic circuit 1050 may be implemented with the depicted PMOS and NMOS transistor stack which performs the XOR operation between the required $C_{in}$, $\overline{C_{in}}$ values for LSB 47 and the produced $C_{out}$ value of bit 48 ($Cout_{48}$) on line 1051 to check if they match or not. The static XOR logic circuit 1050 can be used in place of a dynamic XOR gate operation when the $C_{out}$ value of bit 48 provided from external logic is static. The match signal 1052 from the static XOR compare operation is effectively "OR"ed with the dynamic compare signal 1071 using the complex OR-AND-Invert (OAI) gate 1062 which performs an OR-AND-INVERT function. Insofar as the same comparison is used for the odd array, FIG. 10 shows that the match signal 1052 from the static XOR compare operation is effectively "OR"ed with the dynamic compare signal 1072 from the odd array using the complex OR-AND-Invert (OAI) gate 1063 which performs an OR-AND-INVERT function.

Insofar as additional tag bit column logic is implemented for the odd array (not shown) to generate the speculative odd miss signal 1072, the TAG circuit includes selection circuitry for selecting between the speculative even and odd miss signals 1071, 1072 based on the sum value (e.g., $EA_{51}$) that is computed for the least significant index bit position in Operands A and B (e.g., the sum of Operands A and B at bit position 51). Though not shown, the sum value is computed by processing selected bits from Operands A and B (e.g., bits 52-63) to generate a carry out value for the least significant index bit position (e.g., by computing a carry out value for bit position 52) which is then added to the least significant address bit (LSB bit 51) from Operand A and the least significant address bit (LSB bit 51) from Operand B to generate the sum value ($EA_{51}$) and optionally its complement.

The sum value (e.g., $EA_{51}$) is applied to inverter 1061 and OAI gate 1063, which along with OAI gate 1062 and NAND gate 1064 effectively provide a multiplex or selection function to qualify the output from the speculative even compare 1071 and speculative odd compare 1072, thereby choosing the miss/hit (match) signal 1065 from the odd or even address. If the sum value has a first value (e.g., logical "zero"), then the miss/hit signal 1071 from the even address array is chosen, and if the computed sum value has a second value (e.g., logical "one"), then the miss/hit signal 1072 from the odd address array is chosen. Thus, the sum value signal EA51 which is the bit 51 of the output of the EA adder acts as a select signal for the multiplexer to choose between the speculative even or odd miss/hit signal to output the actual miss/hit signal.

Figure 11:
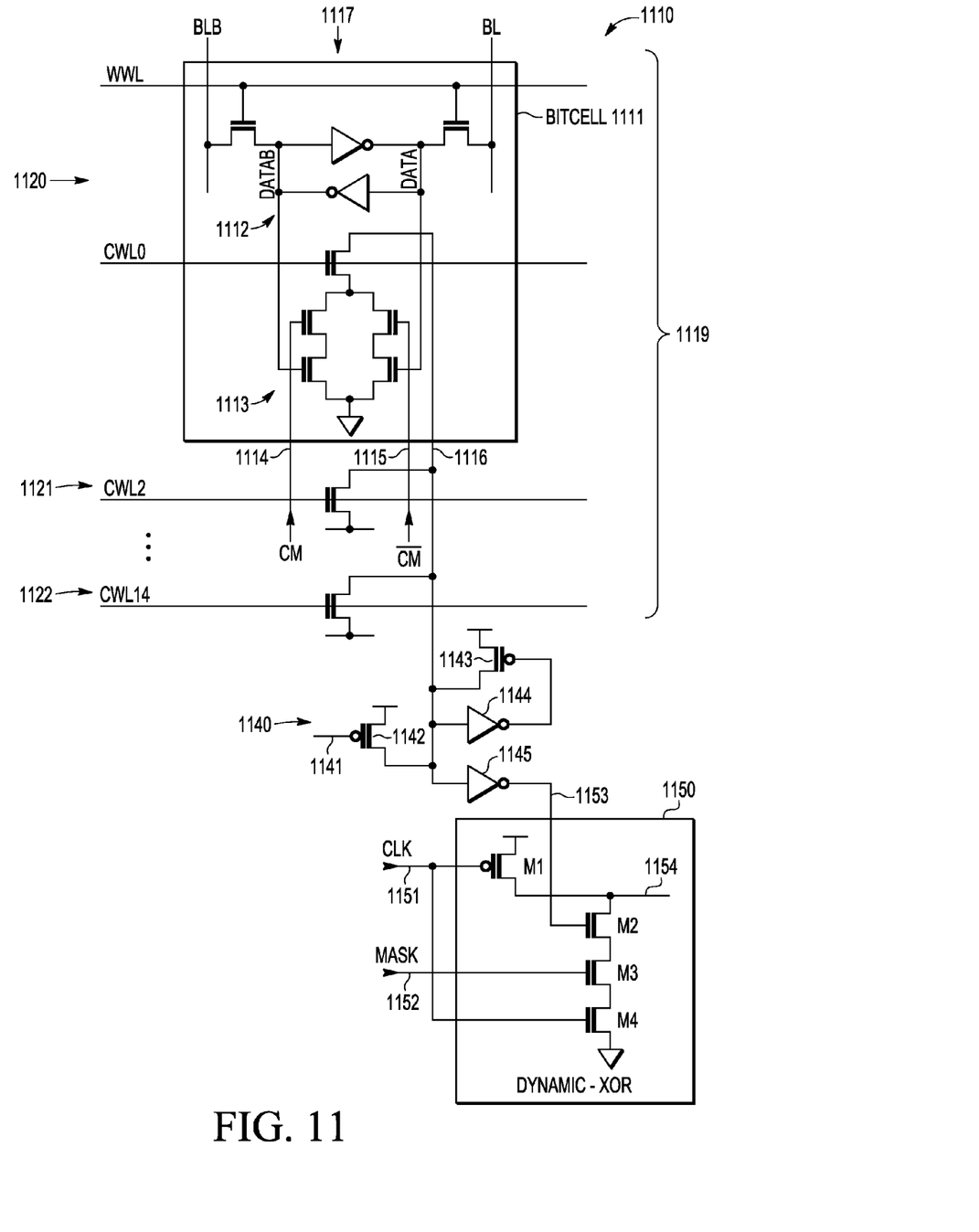
FIG. 11 is a circuit schematic diagram depicting permission bit column logic in an even array in accordance with selected embodiments of the invention.

To illustrate how the permission bitcells are arrayed and processed to identify valid speculative miss signals, reference is now made to FIG. 11 which depicts a circuit schematic diagram of the permission bit column logic 1110 in an even array 1119 in accordance with selected embodiments of the invention. The depicted array 1119 includes a plurality of tag bitcells (e.g., 1111) arranged in a plurality of rows (e.g., 1120, 1121, 1122) and columns (e.g., 1117). Each bitcell (e.g., 1111) may use substantially the same design and operation as shown in FIG. 8 so to generate a permission output signal 1116 in response to first and second control signals (CM, $\overline{CM}$) 1114, 1115 and a compare wordline signal value (e.g., CWL0) for the permission bitcell.

The permission output signal 1116 is applied to the bitline driver output circuit block 1140 which is controlled by the precharge signal line 1141. As shown, the permission output signal 1116 is coupled to a keeper pull-up circuit 1143, 1144 for driving logical "one" values to a predetermined reference voltage (e.g., Vdd), where a first pull-up transistor 1143 is gated by an inverter 1144 which is coupled between the permission output signal line 1116 and the first pull-up transistor 1143. In addition, the permission output signal line 1116 is coupled across a second pull-up transistor 1142 (e.g., PMOS transistor) to a predetermined reference voltage (e.g., Vdd) when the precharge signal line 1141 has a first logical state (e.g., "zero" volts). However, when the precharge signal line 1141 has a second logical state (e.g., "one" volt), the second pull-up transistor 1142 is not conductive, and the permission output signal 1116 is applied to an inverter circuit 1145 for purposes of generating an inverted permission output signal 1153.

The inverted permission output signal 1153 is applied to the dynamic XOR logic circuit block 1150 which provides a dynamic comparator function. As depicted, the dynamic comparator block 1150 is controlled by the clock signal 1151 and mask signal 1152, and controls the dynamic node 1154 (corresponding to the dynamic node 1045 depicted in FIG. 10) to generate a speculative miss signal from the even array 1119, even if all the tag bits on that row would otherwise generate a speculative hit signal. In operation, a logical "zero" stored in the permission bitcell 1111 will generate a logical "one" on the inverted permission output signal 1153, thereby connecting the dynamic node 1154 to the reference supply voltage (e.g., ground) when the clock signal 1151 and the mask signal line 1152 are both set to logical "one" values.

By now, it should be appreciated that there has been provided herein a method and data processing system for generating a speculative miss signal from first and second operands without requiring addition of the first and second operands by accessing an entry in a memory array by placing a tag memory unit in parallel with an operand adder circuit to enable tag lookup and generation of speculative way hit/miss information directly from the operands without using the output sum of the operand adder. In selected embodiments, a computer-implemented method is provided in which first and second operands are received, where the first operand includes base address bits and the second operand includes offset address bits. Each of the base address bits is paired with a corresponding bit from the offset address bits, thereby generating a plurality of paired bits. Using the plurality of paired bits, an indexed content-addressable memory (CAM) array is accessed to generate two speculative miss signals, and the output is selected based on the least significant bit base and offset address bits. This may be done by using the paired bits to generate a plurality of logical values (e.g., PGZ values, such as a P value (computed from a logical XOR operation performed on each of the paired bits), a G value (computed from a logical AND operation performed on each of the paired bits), and a Z value (computed from a logical AND operation performed on inverted versions of each of the paired bits)). In selected embodiments, the PGZ values include a first plurality of PGZ values that are generated from paired index bits from the base address bits and the offset address bits, and the first plurality of PGZ values are mapped to a plurality of wordline functions that are applied to speculatively access a plurality of rows in the indexed CAM array for use in generating the two speculative miss signals. In other embodiments, the PGZ values include a second plurality of PGZ values that are generated from paired tag bits from the base address bits and the offset address bits, and the second plurality of PGZ values and the carry-out value are compared to the speculatively accessed plurality of rows in the indexed CAM array to generate two speculative miss signals. The application of the PGZ values to each CAM bitcell may be implemented by applying a Zero (Z) value, a complementary Generate ($\overline{G}$) value, and a first data node in the CAM bitcell to a first logic circuit to generate a complementary carry-out value ($\overline{C_{out}}$); applying a Generate (G) value, Propagate (P) value and a second data node in the CAM bitcell to a second logic circuit to generate a carry-out value ($C_{out}$); applying a Propagate (P) value, complementary Propagate ($\overline{P}$) value, a first data node in the CAM bitcell, and a second data node in the CAM bitcell to a third logic circuit to generate a carry-in value ($C_{in}$); and applying a Propagate (P) value, complementary Propagate ($\overline{P}$) value, a first data node in the CAM bitcell, and a second data node in the CAM bitcell to a fourth logic circuit to generate a complementary carry-in value ($\overline{C_{in}}$). In parallel, a carry-out value is generated from the most significant bit of the base address bits and the most significant bit of the offset address bits. By applying the PGZ values and the carry-out value to the indexed CAM array, two speculative hit/miss signals are generated. This may be accomplished by applying the PGZ values and carry-out value to CAM bitcells in even and odd arrays, where each CAM bitcell comprises embedded partial A+B=K comparison logic circuitry for generating required carry-in and produced carry-out values for each CAM bitcell. In this way, the speculative miss signals may be generated directly from the base address bits and the offset address bits without requiring computation of a logical sum of the base address bits and the offset address bits. Simultaneously or in parallel with the generation of the PGZ values, a sum value may be computed by adding at least the least significant bit of the base address bits with the least significant bit of the offset address bits. Thus, if the operands include additional, less significant bits, the sum value is computed by adding the least significant bit of the base address bits, the least significant bit of the offset address bits, and any carry-in value from any less significant bits in the first and second operands. The sum value is used to select one of the speculative hit/miss signals for output. The foregoing steps are performed concurrently while computing an effective address by adding the first and second operands in an operand adder circuit.

In another form, there is provided a data processing system and associated method of operation wherein one or more processors use selection circuitry to address a memory array entry from first and second speculatively indexed content addressable memory (CAM) arrays (e.g., an even CAM array and an odd CAM array) using a first plurality of base address bits and a first plurality of offset address bits without adding the first plurality of base address bits and the first plurality of offset address bits. Each bitcell in the first and second speculatively indexed content CAM arrays includes embedded partial A+B=K compare logic to receive PGZ values generated from tag bits in the first plurality of base address bits and the first plurality of offset address bits, and to compute therefrom a carry out value and a carry in value for the bitcell. In selected embodiments, each bitcell includes a memory unit for storing a K value and a $\overline{K}$ value at first and second data nodes, and the embedded partial A+B=K compare logic includes a first comparison logic circuit for generating a complementary carry out value for the bitcell by comparing the K value to a received Z value and $\overline{G}$ value generated from tag bits in the first plurality of base address bits and the first plurality of offset address bits; a second comparison logic circuit for generating a carry out value for the bitcell by comparing the $\overline{K}$ value to a received G value and P value generated from tag bits in the first plurality of base address bits and the first plurality of offset address bits; a third comparison logic circuit for generating a carry in value for the bitcell by comparing the K and $\overline{K}$ values to a received P value and $\overline{P}$ value generated from tag bits in the first plurality of base address bits and the first plurality of offset address bits; and a fourth comparison logic circuit for generating a complementary carry in value for the bitcell by comparing the K and $\overline{K}$ values to a received $\overline{P}$ value generated from tag bits in the first plurality of base address bits and the first plurality of offset address bits. The selection circuitry addresses a memory array entry from the memory array in response to a first plurality of base address bits and a first plurality of offset address bits, wherein each of the first plurality of base address bits is paired with a corresponding bit from the first plurality of offset address bits. To this end, the selection circuitry includes a PGZ generator that generates PGZ values based upon the paired address bits wherein a P value results from a logical XOR operation on each address bit pair, a G value results from a logical AND operation on each address bit pair, and a Z value results from a logical AND operation performed on each inverted address bit pair. The selection circuitry also includes wordline generator circuits that evaluate PGZ values generated from index bits in the first plurality of base address bits and the first plurality of offset address bits to speculatively index a possible odd memory array entry address from the odd CAM array and a possible even memory array entry address from the even CAM array. In the selection circuitry, a first fast carry generation circuitry executes while the PGZ generator generates the PGZ values to generate a first carry value for the least significant tag bits in the first plurality of base address bits and the first plurality of offset address bits, and a dynamic comparison circuit performs a speculative comparison on the possible odd memory array entry address and a possible even memory array entry address under control of the first carry out value. In selected embodiments, the dynamic comparison circuit performs the speculative comparison at the bitcell by comparing the carry in value from the bitcell with a carry out value from an adjacent less significant bitcell to indicate a hit if the carry in value and carry out value match, and to indicate a miss if the carry in value and carry out value do not match. The selection circuit also includes a second fast carry generation circuitry that executes while the PGZ generator generates the PGZ values, resulting in a second carry value. A match selector selects one of the possible memory array entry addresses based upon the second carry value provided by the second fast carry generation circuitry, and a latch latches the memory array entry corresponding to the selected memory array entry address. The data processing system also includes an operand adder circuit placed in parallel with the selection circuit for concurrently computing an effective address by adding the first and second operands.

In yet another form, there is provided a computer-implemented method for generating a miss signal from a CAM array. As the disclosed methodology, a base operand and offset operand are received, wherein each operand comprises a first plurality of tag and index address bits. Each tag and index address bits from the base operand is paired with a corresponding tag and index address bit from the offset operand, thereby forming a plurality of bit pairs. In addition, one or more PGZ values are generated for each bit pair by computing a P value from a logical XOR operation performed on each bit pair, a G value from a logical AND operation performed on each bit pair, a Z value from a logical AND operation performed on inverted versions of each bit pair. PGZ values generated from paired index address bits are run through a plurality of wordline generators to speculatively index a possible odd memory array entry address from an odd CAM array and a possible even memory array entry address from an even CAM array. While the PGZ values are being generated, a fast carry generation is performed on a second plurality of bits which includes the index address bits from the base and offset operands to generate a first carry value for the least significant tag address bits in the base and offset operands. The first carry value and PGZ values generated from paired tag bits are applied through the odd CAM array and even CAM array to generate a speculative odd miss signal and a speculative even miss signal, respectively. In selected embodiments, the values are applied to the CAM array by storing a K value in a first bitcell of the CAM array, and then comparing the K value with PGZ values generated from tag address bits in the base and offset operands with partial A+B=K logic embedded in the first bitcell to generate a carry out value and a carry in value for the first bitcell. In this way, the carry in value from the first bitcell can be compared with a carry out value from an adjacent less significant bitcell to indicate a hit if the carry in value and carry out value match, and to indicate a miss if the carry in value and carry out value do not match. By computing a sum value for the least significant index bits in the base and offset operands while the PGZ values are being generated, one of the speculative odd miss signal and speculative even miss signal may be selected based upon the sum value.

The methods and systems for accessing a memory array circuit directly as shown and described herein may be implemented in hardware and/or software stored on a computer-readable medium and executed as a computer program on a general purpose or special purpose computer to perform certain tasks. In selected example implementations, the invention is implemented with hardware and software for accessing random access memory of the computer, including but not limited to hardware that is used to implement TAG circuit, fast carry generation and sum logic circuits, as well as software instructions or microcode used to implement the PGZ generation logic block. Until required by the computer, the set of instructions or microcode may be stored as instructions (program code) or other functional descriptive material in a code module in another computer memory, for example, in a hard disk drive, or in a removable memory such as an flash memory or optical disk (for eventual use in a CD ROM) or floppy disk (for eventual use in a floppy disk drive), or downloaded via the Internet or other computer network. In addition or in the alternative, a software implementation may be used, whereby some or all of the tag memory operations may be implemented with modules (e.g., procedures, functions, and so on) that perform the functions described herein. It will be appreciated that the separation of functionality into modules is for illustrative purposes, and alternative embodiments may merge the functionality of multiple software modules into a single module or may impose an alternate decomposition of functionality of modules. In any software implementation, the software code may be executed by a processor or controller, with the code and any underlying or processed data being stored in any machine-readable or computer-readable storage medium, such as an on-board or external memory unit. Thus, the present invention may be implemented as a computer program product for use in a computer in which the claimed functionality may be implemented in whole or in part as a state machine, firmware or software that is tangibly embodied in a computer readable, non-transitory storage medium.

Although the described exemplary embodiments disclosed herein are directed to various schemes for using a staged comparison with speculative indexed content addressable memory to generate speculative hit/miss signals, the present invention is not necessarily limited to the example embodiments which illustrate inventive aspects of the present invention that are applicable to a wide variety of latch devices, manufacturing methods and operational methodologies. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives. modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. The term "coupled," as used herein, is not intended to be limited to a direct coupling or a mechanical coupling. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for generating a speculative miss signal from first and second operands without requiring addition of the first and second operands, comprising:
   receiving a first operand comprising base address bits and a second operand comprising offset address bits;
   pairing each of the base address bits with a corresponding bit from the offset address bits, thereby generating a plurality of paired bits;
   generating a plurality of logical values for each of the plurality of paired bits;
   generating a carry-out value from at least a most significant indexing bit of the base address bits and the most significant indexing bit of the offset address bits; and
   using the plurality of logical values and the carry-out value to access the indexed content addressable memory (CAM) array to generate two speculative miss signals by applying PGZ values to CAM bitcells in even and odd arrays, where each CAM bitcell comprises embedded partial A+B=K comparison logic circuitry for generating required carry-in and produced carry-out values for each CAM bitcell; and
   selecting one of the two speculative miss signals for output based on a sum value computed by adding at least the least significant bit of the base address bits with the least significant bit of the offset address bits;
   where applying PGZ values to each CAM bitcell comprises:
      applying a Zero (Z) value, a complementary Generate ($\overline{G}$) value, and a first data node in the CAM bitcell to a first logic circuit to generate a complementary carry-out value ($\overline{C_{out}}$);
      applying a Generate (G) value, Propagate (P) value and a second data node in the CAM bitcell to a second logic circuit to generate a carry-out value (Cont);
      applying a Propagate (P) value, complementary Propagate ($\overline{P}$) value, a first data node in the CAM bitcell, and a second data node in the CAM bitcell to a third logic circuit to generate a carry-in value (Cin); and applying a Propagate (P) value, complementary Propagate ($\overline{P}$) value, a first data node in the CAM bitcell, and a second data node in the CAM bitcell to a fourth logic circuit to generate a complementary carry-in value ($\overline{C_{in}}$).

2. The method of claim 1, where adding at least the least significant bit of the base address bits with the least significant bit of the offset address bits takes place in parallel with generating the plurality of logical values.

3. The method of claim 2, where generating the plurality of logical values comprises generating a first plurality of PGZ values from paired index bits from the base address bits and the offset address bits, where the first plurality of PGZ values comprises a P value computed from a logical XOR operation performed on each of the paired index bits, a G value computed from a logical AND operation performed on each of the paired index bits, and a Z value computed from a logical AND operation performed on each of the inverted paired index bits.

4. The method of claim 3, where using the plurality of logical values comprises mapping the first plurality of PGZ values to a plurality of wordline functions that are applied to speculatively access a plurality of rows in the indexed CAM array for use in generating the two speculative miss signals.

5. The method of claim 4, where generating the plurality of logical values comprises generating a second plurality of PGZ values from paired tag bits from the base address bits and the offset address bits.

6. The method of claim 5, where using the plurality of logical values comprises comparing the second plurality of PGZ values and the carry-out value to the speculatively accessed plurality of rows in the indexed CAM array to generate two speculative miss signals.

7. The method of claim 1, where the two speculative miss signals are generated directly from the base address bits and the offset address bits without requiring computation of a logical sum of the base address bits and the offset address bits.

8. The method of claim 1, further comprising computing the sum value by adding a least significant indexing bit of the base address bits, the least significant indexing bit of the offset address bits, and any carry-in value from any less significant bits in the first and second operands.

9. A data processing system comprising:
one or more processors;
a memory array accessible by the one or more processors comprising first and second speculatively indexed content addressable memory (CAM) arrays comprising an even CAM array and an odd CAM array, each comprising a plurality of memory array entries;
selection circuitry that addresses a memory array entry from the first and second speculatively indexed CAM arrays using a first plurality of base address bits and a first plurality of offset address bits without adding the first plurality of base address bits and the first plurality of offset address bits, wherein each of the first plurality of base address bits is paired with a corresponding bit from the first plurality of offset address bits; and
an operand adder circuit placed in parallel with the selection circuit for concurrently computing an effective address by adding the first and second operands;
where the first and second speculatively indexed CAM arrays comprise one or more bitcells, each comprising:
a memory unit comprising two cross-coupled inverters coupled between first and second data nodes for storing a K value and a $\overline{K}$ value at the first and second data nodes;
a first comparison logic circuit for generating a complementary carry out value for the bitcell by comparing the K value to a received Z value and $\overline{G}$ value generated from tag bits in the first plurality of base address bits and the first plurality of offset address bits;
a second comparison logic circuit for generating a carry out value for the bitcell by comparing the $\overline{K}$ value to a received G value and P value generated from tag bits in the first plurality of base address bits and the first plurality of offset address bits;
a third comparison logic circuit for generating a carry in value for the bitcell by comparing the K and $\overline{K}$ values to a received P value and $\overline{P}$ value generated from tag bits in the first plurality of base address bits and the first plurality of offset address bits; and
a fourth comparison logic circuit for generating a complementary carry in value for the bitcell by comparing the K and $\overline{K}$ values to a received $\overline{P}$ value generated from tag bits in the first plurality of base address bits and the first plurality of offset address bits.

10. The data processing system of claim 9, where the selection circuitry comprises:
a PGZ generator that generates PGZ values based upon the paired address bits wherein a P value results from a logical XOR operation on each address bit pair, a G value results from a logical AND operation on each address bit pair, and a Z value results from a logical AND operation performed on each inverted address bit pair;
a plurality of wordline generator circuits that evaluate PGZ values generated from index bits in the first plurality of base address bits and the first plurality of offset address bits to speculatively index a possible odd memory array entry address from the odd CAM array and a possible even memory array entry address from the even CAM array;
a first carry generation circuitry that executes while the PGZ generator generates the PGZ values, the first carry generation circuitry resulting in a first carry value for a least significant tag bits in the first plurality of base address bits and the first plurality of offset address bits;
a dynamic comparison circuit that performs a speculative comparison on the possible odd memory array entry address and a possible even memory array entry address under control of the first carry out value;
a second carry generation circuitry that executes while the PGZ generator generates the PGZ values, the second carry generation circuitry resulting in a second carry value;
a match selector that selects one of the possible memory array entry addresses based upon the second carry value provided by the second carry generation circuitry; and
a latch that latches the memory array entry corresponding to the selected memory array entry address.

11. The data processing system of claim 10, where the dynamic comparison circuit performs the speculative comparison at the bitcell by comparing the carry in value from the bitcell with a carry out value from an adjacent less significant bitcell to indicate a hit if the carry in value and carry out value match, and to indicate a miss if the carry in value and carry out value do not match.

12. The data processing system of claim 9, wherein the first and second speculatively indexed CAM arrays comprise bitcells comprising embedded partial A+B=K compare logic to receive PGZ values generated from tag bits in the first plurality of base address bits and the first plurality of offset address bits, and to compute therefrom a carry out value and a carry in value for the bitcell.

13. The data processing system of claim 9, wherein the first and second speculatively indexed CAM arrays comprise one or more bitcells, each comprising:

a memory unit comprising two cross-coupled inverters coupled between first and second data nodes for storing a K value and a $\overline{K}$ value at the first and second data nodes;

embedded partial A+B=K logic for comparing the K and $\overline{K}$ values to received PGZ values generated from tag bits in the first plurality of base address bits and the first plurality of offset address bits, and to compute therefrom a carry out value and a carry in value for the bitcell.

\* \* \* \* \*